United States Patent
Shifren et al.

(10) Patent No.: US 9,406,567 B1
(45) Date of Patent: Aug. 2, 2016

(54) METHOD FOR FABRICATING MULTIPLE TRANSISTOR DEVICES ON A SUBSTRATE WITH VARYING THRESHOLD VOLTAGES

(75) Inventors: Lucian Shifren, San Jose, CA (US); Pushkar Ranade, Los Gatos, CA (US); Thomas Hoffmann, San Jose, CA (US); Scott E. Thompson, Gainesville, FL (US)

(73) Assignee: Mie Fujitsu Semiconductor Limited, Kuwana, Mie (JP)

( * ) Notice: Subject to any disclaimer, the term of this patent is extended or adjusted under 35 U.S.C. 154(b) by 550 days.

(21) Appl. No.: 13/407,527

(22) Filed: Feb. 28, 2012

(51) Int. Cl.
*H01L 21/8238* (2006.01)
*H01L 21/8234* (2006.01)

(52) U.S. Cl.
CPC .............................. *H01L 21/823807* (2013.01)

(58) Field of Classification Search
None
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |
| 4,780,748 A | 10/1988 | Cunningham et al. | |
| 4,819,043 A | 4/1989 | Yazawa et al. | |
| 4,885,477 A | 12/1989 | Bird et al. | |
| 4,908,681 A | 3/1990 | Nishida et al. | |
| 4,945,254 A | 7/1990 | Robbins | |
| 4,956,311 A | 9/1990 | Liou et al. | |
| 5,034,337 A | 7/1991 | Mosher et al. | |

(Continued)

FOREIGN PATENT DOCUMENTS

| EP | 0274278 | 7/1988 |
|---|---|---|
| EP | 0312237 | 4/1989 |

(Continued)

OTHER PUBLICATIONS

Scholz, R et al., "Carbon-Induced Undersaturation of Silicon Self-Interstitials", Appl. Phys. Lett. 72(2), pp. 200-202, Jan. 1998.

(Continued)

*Primary Examiner* — Calvin Choi
(74) *Attorney, Agent, or Firm* — Baker Botts L.L.P.

(57) ABSTRACT

Fabrication of a first device on a substrate is performed by exposing a first device region, removing a portion of the substrate to create a trench in the first device region, forming a screen layer with a first dopant concentration in the trench on the substrate, and forming an epitaxial channel on the screen layer having a first thickness. On or more other devices are similarly formed on the substrate independent of each other with epitaxial channels of different thicknesses than the first thickness. Devices with screen layers having the same dopant concentration but with different epitaxial channel thicknesses have different threshold voltages. Thus, a wide variety of threshold voltage devices can be formed on the same substrate. Further threshold voltage setting can be achieved through variations in the dopant concentration of the screen layers.

12 Claims, 4 Drawing Sheets

(56) References Cited

U.S. PATENT DOCUMENTS

| | | | |
|---|---|---|---|
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,192,701 A * | 3/1993 | Iwasaki | 438/174 |
| 5,208,473 A | 5/1993 | Komori et al. | |
| 5,294,821 A | 3/1994 | Iwamatsu | |
| 5,298,763 A | 3/1994 | Shen et al. | |
| 5,369,288 A | 11/1994 | Usuki | |
| 5,373,186 A | 12/1994 | Schubert et al. | |
| 5,384,476 A | 1/1995 | Nishizawa et al. | |
| 5,426,328 A | 6/1995 | Yilmaz et al. | |
| 5,444,008 A | 8/1995 | Han et al. | |
| 5,552,332 A | 9/1996 | Tseng et al. | |
| 5,559,368 A | 9/1996 | Hu et al. | |
| 5,608,253 A | 3/1997 | Liu et al. | |
| 5,622,880 A | 4/1997 | Burr et al. | |
| 5,624,863 A | 4/1997 | Helm et al. | |
| 5,625,568 A | 4/1997 | Edwards et al. | |
| 5,641,980 A | 6/1997 | Yamaguchi et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe et al. | |
| 5,726,562 A | 3/1998 | Mizuno | |
| 5,731,626 A | 3/1998 | Eaglesham et al. | |
| 5,736,419 A | 4/1998 | Naem | |
| 5,753,555 A | 5/1998 | Hada | |
| 5,754,826 A | 5/1998 | Gamal et al. | |
| 5,756,365 A | 5/1998 | Kakumu | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu et al. | |
| 5,885,876 A | 3/1999 | Dennen | |
| 5,889,315 A | 3/1999 | Farrenkopf et al. | |
| 5,895,954 A | 4/1999 | Yasumura et al. | |
| 5,899,714 A | 5/1999 | Farremkopf et al. | |
| 5,918,129 A | 6/1999 | Fulford, Jr. et al. | |
| 5,923,067 A | 7/1999 | Voldman | |
| 5,923,987 A | 7/1999 | Burr | |
| 5,936,868 A | 8/1999 | Hall | |
| 5,946,214 A | 8/1999 | Heavlin et al. | |
| 5,985,705 A | 11/1999 | Seliskar | |
| 5,989,963 A | 11/1999 | Luning et al. | |
| 6,001,695 A | 12/1999 | Wu | |
| 6,020,227 A | 2/2000 | Bulucea | |
| 6,043,139 A | 3/2000 | Eaglesham et al. | |
| 6,060,345 A | 5/2000 | Hause et al. | |
| 6,060,364 A | 5/2000 | Maszara et al. | |
| 6,066,533 A | 5/2000 | Yu | |
| 6,072,217 A | 6/2000 | Burr | |
| 6,087,210 A | 7/2000 | Sohn | |
| 6,087,691 A | 7/2000 | Hamamoto | |
| 6,088,518 A | 7/2000 | Hsu | |
| 6,091,286 A | 7/2000 | Blauschild | |
| 6,096,611 A | 8/2000 | Wu | |
| 6,103,562 A | 8/2000 | Son et al. | |
| 6,121,153 A | 9/2000 | Kikkawa | |
| 6,147,383 A | 11/2000 | Kuroda | |
| 6,153,920 A | 11/2000 | Gossmann et al. | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,198,139 B1 * | 3/2001 | Ishida | 257/372 |
| 6,198,157 B1 | 3/2001 | Ishida et al. | |
| 6,218,892 B1 | 4/2001 | Soumyanath et al. | |
| 6,218,895 B1 | 4/2001 | De et al. | |
| 6,221,724 B1 | 4/2001 | Yu et al. | |
| 6,229,188 B1 | 5/2001 | Aoki et al. | |
| 6,232,164 B1 | 5/2001 | Tsai et al. | |
| 6,235,597 B1 | 5/2001 | Miles | |
| 6,245,618 B1 | 6/2001 | An et al. | |
| 6,268,640 B1 | 7/2001 | Park et al. | |
| 6,271,070 B2 | 8/2001 | Kotani et al. | |
| 6,271,551 B1 | 8/2001 | Schmitz et al. | |
| 6,288,429 B1 | 9/2001 | Iwata et al. | |
| 6,297,132 B1 | 10/2001 | Zhang et al. | |
| 6,300,177 B1 | 10/2001 | Sundaresan et al. | |
| 6,313,489 B1 | 11/2001 | Letavic et al. | |
| 6,319,799 B1 | 11/2001 | Ouyang et al. | |
| 6,320,222 B1 | 11/2001 | Forbes et al. | |
| 6,323,525 B1 | 11/2001 | Noguchi et al. | |
| 6,326,666 B1 | 12/2001 | Bernstein et al. | |
| 6,335,233 B1 | 1/2002 | Cho et al. | |
| 6,358,806 B1 | 3/2002 | Puchner | |
| 6,380,013 B2 * | 4/2002 | Lee | 438/184 |
| 6,380,019 B1 | 4/2002 | Yu et al. | |
| 6,391,752 B1 | 5/2002 | Colinge et al. | |
| 6,426,260 B1 | 7/2002 | Hshieh | |
| 6,426,279 B1 | 7/2002 | Huster et al. | |
| 6,432,754 B1 | 8/2002 | Assaderaghi et al. | |
| 6,444,550 B1 | 9/2002 | Hao et al. | |
| 6,444,551 B1 | 9/2002 | Ku et al. | |
| 6,449,749 B1 | 9/2002 | Stine | |
| 6,461,920 B1 | 10/2002 | Shirahata et al. | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,503,805 B2 | 1/2003 | Wang et al. | |
| 6,506,640 B1 | 1/2003 | Ishida et al. | |
| 6,518,623 B1 | 2/2003 | Oda et al. | |
| 6,521,470 B1 | 2/2003 | Lin et al. | |
| 6,534,373 B1 | 3/2003 | Yu | |
| 6,541,328 B2 | 4/2003 | Whang et al. | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,552,377 B1 | 4/2003 | Yu | |
| 6,573,129 B2 | 6/2003 | Hoke et al. | |
| 6,576,535 B2 | 6/2003 | Drobny et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,627,473 B1 | 9/2003 | Oikawa et al. | |
| 6,630,710 B1 | 10/2003 | Augusto | |
| 6,660,605 B1 | 12/2003 | Liu | |
| 6,662,350 B2 | 12/2003 | Fried et al. | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,743,684 B2 | 6/2004 | Liu | |
| 6,751,519 B1 | 6/2004 | Satya et al. | |
| 6,753,230 B2 | 6/2004 | Sohn et al. | |
| 6,760,900 B2 | 7/2004 | Rategh et al. | |
| 6,770,944 B2 | 8/2004 | Nishinohara et al. | |
| 6,787,424 B1 | 9/2004 | Yu | |
| 6,797,553 B2 | 9/2004 | Adkisson et al. | |
| 6,797,602 B1 | 9/2004 | Kluth et al. | |
| 6,797,994 B1 | 9/2004 | Hoke et al. | |
| 6,808,004 B2 | 10/2004 | Kamm et al. | |
| 6,808,994 B1 | 10/2004 | Wang | |
| 6,813,750 B2 | 11/2004 | Usami et al. | |
| 6,821,825 B2 | 11/2004 | Todd et al. | |
| 6,821,852 B2 | 11/2004 | Rhodes | |
| 6,822,297 B2 | 11/2004 | Nandakumar et al. | |
| 6,831,292 B2 | 12/2004 | Currie et al. | |
| 6,835,639 B2 | 12/2004 | Rotondaro et al. | |
| 6,852,602 B2 | 2/2005 | Kanzawa et al. | |
| 6,852,603 B2 | 2/2005 | Chakravarthi et al. | |
| 6,881,641 B2 | 4/2005 | Wieczorek et al. | |
| 6,881,987 B2 | 4/2005 | Sohn | |
| 6,891,439 B2 | 5/2005 | Jaehne et al. | |

(56) References Cited

U.S. PATENT DOCUMENTS

| | | |
|---|---|---|
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |

(56) References Cited

U.S. PATENT DOCUMENTS

| | | |
|---|---|---|
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,941,776 B2 | 5/2011 | Majumder et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,385 B2 | 6/2011 | Jeong et al. |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,286,180 B2 | 10/2012 | Foo |
| 8,288,798 B2 | 10/2012 | Passlack |
| 8,299,562 B2 | 10/2012 | Li et al. |
| 8,324,059 B2 | 12/2012 | Guo et al. |
| 8,614,128 B1 * | 12/2013 | Thompson et al. ........... 438/275 |
| 8,637,955 B1 * | 1/2014 | Wang et al. .................... 257/506 |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1 | 7/2004 | Sohn |
| 2004/0175893 A1 | 9/2004 | Vatus et al. |
| 2004/0180488 A1 | 9/2004 | Lee |
| 2005/0023605 A1 * | 2/2005 | Amato ........................ 257/328 |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0175657 A1 * | 8/2006 | Babcock et al. ............... 257/335 |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |

(56) References Cited

U.S. PATENT DOCUMENTS

| | | | |
|---|---|---|---|
| 2011/0212590 | A1 | 9/2011 | Wu et al. |
| 2011/0230039 | A1 | 9/2011 | Mowry et al. |
| 2011/0242921 | A1 | 10/2011 | Tran et al. |
| 2011/0248352 | A1 | 10/2011 | Shifren |
| 2011/0294278 | A1 | 12/2011 | Eguchi et al. |
| 2011/0309447 | A1* | 12/2011 | Arghavani et al. ............ 257/368 |
| 2012/0021594 | A1 | 1/2012 | Gurtej et al. |
| 2012/0034745 | A1 | 2/2012 | Colombeau et al. |
| 2012/0056275 | A1 | 3/2012 | Cai et al. |
| 2012/0065920 | A1 | 3/2012 | Nagumo et al. |
| 2012/0080759 | A1* | 4/2012 | Ema et al. ..................... 257/402 |
| 2012/0108050 | A1 | 5/2012 | Chen et al. |
| 2012/0132998 | A1 | 5/2012 | Kwon et al. |
| 2012/0138953 | A1 | 6/2012 | Cai et al. |
| 2012/0146155 | A1 | 6/2012 | Hoentschel et al. |
| 2012/0167025 | A1 | 6/2012 | Gillespie et al. |
| 2012/0187491 | A1 | 7/2012 | Zhu et al. |
| 2012/0190177 | A1 | 7/2012 | Kim et al. |
| 2012/0223363 | A1 | 9/2012 | Kronholz et al. |
| 2013/0280871 | A1* | 10/2013 | Hyun et al. ................... 438/217 |
| 2014/0103406 | A1* | 4/2014 | Wang et al. ................... 257/288 |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2003298060 | * 10/2003 |
| JP | 2004087671 | 3/2004 |
| KR | 794094 | 1/2008 |
| WO | WO2011/062788 | 5/2011 |

OTHER PUBLICATIONS

Banerjee, et al. "Compensating Non-Optical Effects using Electrically-Driven Optical Proximity Correction", Proc. of SPIE vol. 7275 72750E, 2009.

Cheng, et al. "Extremely Thin SOI (ETSOI) CMOS with Record Low Variability for Low Power System-on-Chip Applications", Electron Devices Meeting (IEDM), Dec. 2009.

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213, 2009.

Drennan, et al. "Implications of Proximity Effects for Analog Design", Custom Integrated Circuits Conference, pp. 169-176, Sep. 2006.

Hook, et al. "Lateral Ion Implant Straggle and Mask Proximity Effect", IEEE Transactions on Electron Devices, vol. 50, No. 9, pp. 1946-1951, Sep. 2003.

Hori, et al., "A 0.1 µm CMOS with a Step Channel Profile Formed by Ultra High Vacuum CVD and In-Situ Doped Ions", Proceedsing of the International Electron Devices Meeting, New York, IEEE, US, pp. 909-911, Dec. 5, 1993.

Matshuashi, et al. "High-Performance Double-Layer Epitaxial-Channel PMOSFET Compatible with a Single Gate CMOSFET", Symposium on VLSI Technology Digest of Technical Papers, pp. 36-37, 1996.

Shao, et al., "Boron Diffusion in Silicon: The Anomalies and Control by Point Defect Engineering", Materials Science and Engineering R: Reports, vol. 42, No. 3-4, pp. 65-114, Nov. 1, 2003, Nov. 2012.

Sheu, et al. "Modeling the Well-Edge Proximity Effect in Highly Scaled MOSFETs", IEEE Transactions on Electron Devices, vol. 53, No. 11, pp. 2792-2798, Nov. 2006.

Ohguro, T et al., "An 0.18-µm CMOS for Mixed Digital and Analog Aplications with Zero-Volt-Vth Epitaxial-Channel MOSFETs", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al, "Scaling the Si MOSFET: From Bulk to SOI to Bulk", IEEE Transactions on Electron Devices, vol. 39, No. 7, Jul. 1992.

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836, Dec. 13-15, 2004.

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93, 2006.

Wong, H et al., "Nanoscale CMOS", Proceedings of the IEEE, Vo. 87, No. 4, pp. 537-570, Apr. 1999.

Abiko, H et al., "A Channel Engineering Combined with Channel Epitaxy Optimization and TED Suppression for 0.15µm n-n Gate CMOS Technology", 1995 Symposium on VLSI Technology Digest of Technical Papers, pp. 23-24, 1995.

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content $Si_{1-y}C_y$ Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

'Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-µm Delta-Doped MOSFET Fabricated with Post-Low-Energy Implanting Selective Epitaxy" IEEE Transactions on Electron Devices, vol. 45, No. 4, pp. 809-814, Apr. 1998.

* cited by examiner

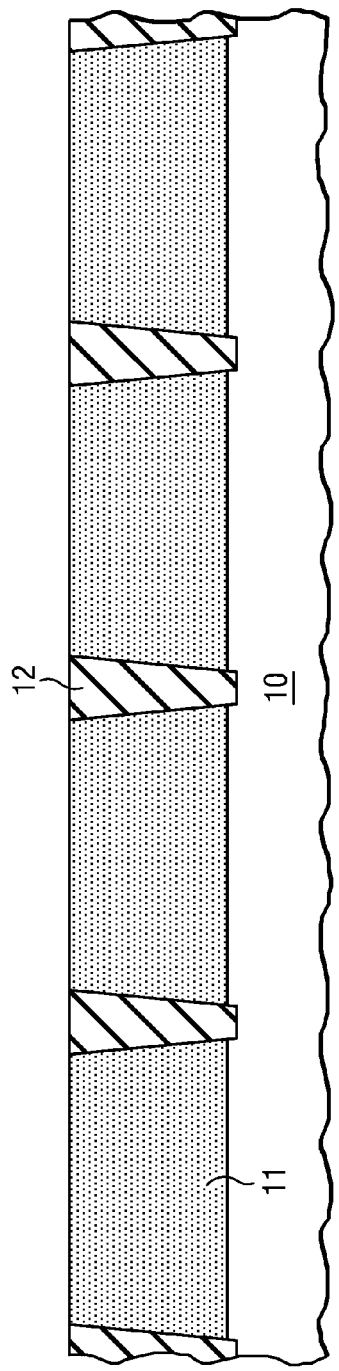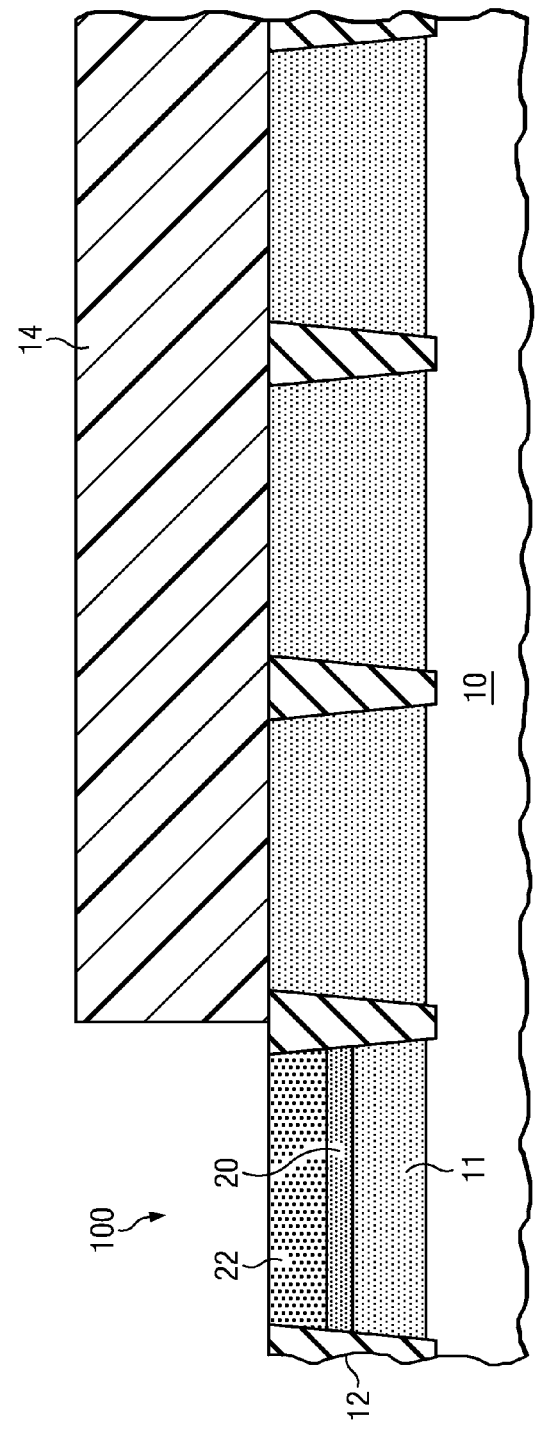

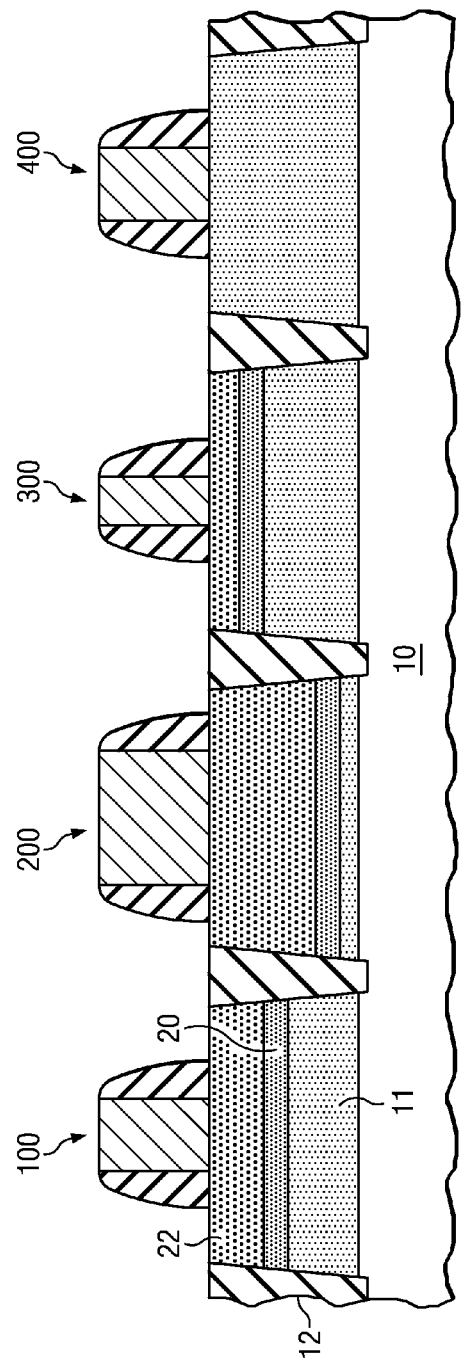
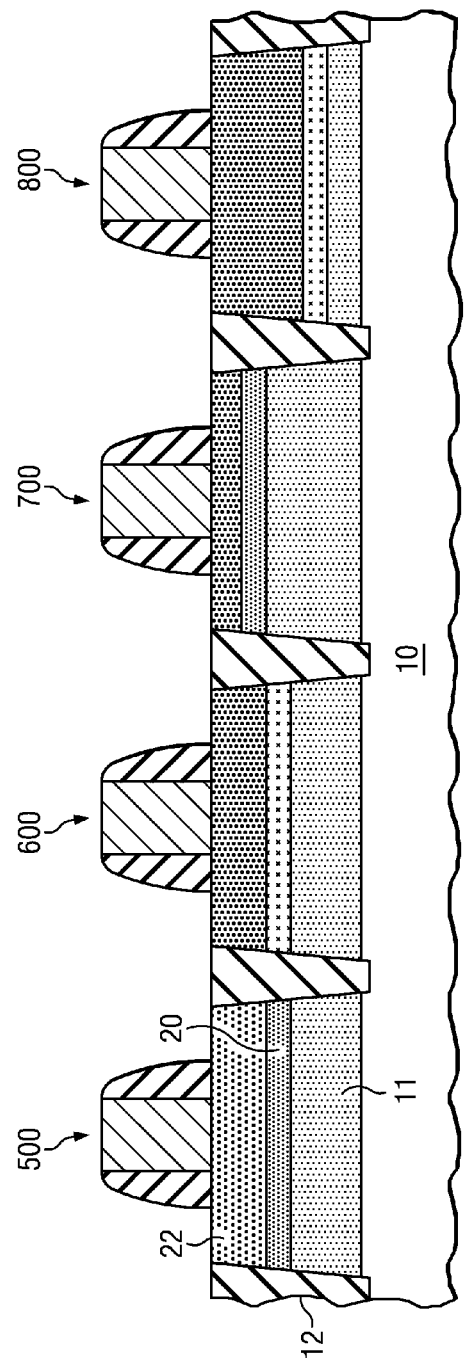
FIG. 1D
FIG. 1E

METHOD FOR FABRICATING MULTIPLE TRANSISTOR DEVICES ON A SUBSTRATE WITH VARYING THRESHOLD VOLTAGES

TECHNICAL FIELD

The present disclosure relates in general to semiconductor devices and manufacturing processes and more particularly to a method for fabricating multiple transistor devices on a substrate with varying threshold voltages.

BACKGROUND

Cost effective electronic manufacturing requires transistor structures and manufacturing processes that are reliable at nanometer scales, and that do not require expensive or unavailable tools or process control conditions. While it is difficult to balance the many variables that control transistor electrical performance, finding suitable transistor dopant structures and manufacturing technique that result in acceptable electrical characteristics such as charge carrier mobility and threshold voltage levels are a key aspect of such commercially useful transistors.

SUMMARY

From the foregoing, it may be appreciated by those of skill in the art that a need has arisen for a technique to fabricate improved transistor devices that on a substrate that provide various threshold voltage control options and improved operational performance. In accordance with the following disclosure, there is provided a method for fabricating multiple transistor devices on a substrate with varying threshold voltages that substantially eliminates or greatly reduces disadvantages and problems associated with conventional transistor device fabrication and design.

According to an embodiment of the present disclosure, a method for fabricating multiple transistor devices on a substrate with varying threshold voltages includes forming a first device in a substrate having a screen layer with a first dopant concentration and an undoped epitaxial channel with a first thickness. A second device is formed in the substrate independent of the first device. The second device has a screen layer with a second dopant concentration and an undoped epitaxial channel with a second thickness where the second thickness is different than the first thickness such that the first and second devices have different threshold voltages. Other devices may be formed with varying epitaxial channel thicknesses and varying screen layer dopant concentrations to provide further threshold voltage options.

The present disclosure describes various technical advantages and features not present in conventional transistor fabrication and design. Embodiments of the present disclosure may enjoy some, all, or none of these advantages. Other technical advantages may be readily apparent to one skilled in the art from the following figures, description, and claims.

BRIEF DESCRIPTION OF THE DRAWINGS

For a more complete understanding of the present disclosure, reference is made to the following description taken in conjunction with the accompanying drawings, wherein like reference numerals represent like parts, in which:

FIGS. 1A to 1E illustrate a fabrication process for multiple transistor devices on a substrate with varying threshold voltage options;

DETAILED DESCRIPTION

Figure 1C:
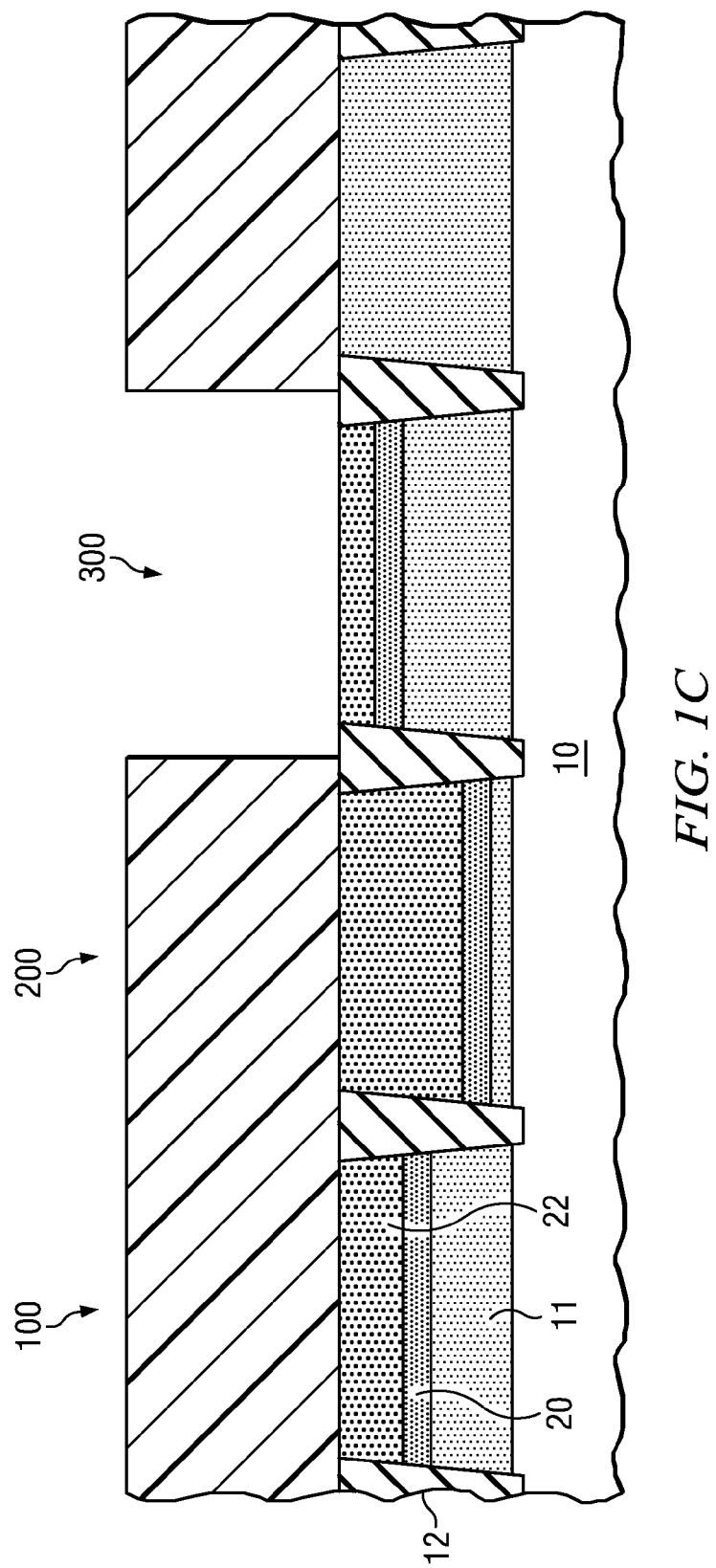

FIGS. 1A-1E show a process for manufacturing multiple transistor devices on a substrate 10 and some with varying threshold voltage settings. Devices with varying voltage threshold settings are generally categorized as Low Threshold Voltage (LVT), Super Low Threshold Voltage (SLVT), Standard Threshold Voltage (SVT), High Threshold Voltage (HVT), and Super High Threshold Voltage (SHVT).

In FIG. 1A, shallow trench isolation regions 12 are formed in substrate 10. Shallow trench isolation regions 12 are formed through use of any conventional fabrication techniques known in the industry. Shallow trench isolation regions 12 define device regions where separate devices are to be formed.

In FIG. 1B, formation of a transistor device begins by placing a photoresist layer 14 over substrate 10 to expose a first device region 100. At first device region 100, a first predetermined thickness of substrate is etched away or otherwise removed. Within the trench left by the removal process, a screen layer 20 is formed on the remaining substrate 10 preferably by way of ion implantation of dopants of the same type (n versus p) as the well, using implant dose and energy conditions selected to form a pre-defined thickness and concentration of dopants for screen layer 20. An undoped epitaxial layer 22 representing a channel for the transistor device is then formed on screen layer 20. By "undoped", the inventors are referring to a preference to use an epitaxial growth process recipe selected to result in an intrinsic semiconductor. Undoped may refer to a degree of dopants inevitably formed in the semiconductor material, preferably in concentration of less than $1 \times 10^{17}$ atoms per $cm^3$, thereby enabling the semiconductor material to be formed in a substantially undoped state. The thickness preferences for the trench and epitaxial layer 22 are further discussed below. The thicknesses are selected to result in the targeted threshold voltage for the device. Generally, the thinner the epitaxial layer 22, the higher the threshold voltage. Therefore, the thinnest epitaxial layer 22 would be used for the SHVT devices, with a thicker epitaxial layer 22 used for HVT devices, a still thicker epitaxial layer 22 used for SVT devices, an even thicker epitaxial layer 22 used for LVT devices, and the thickest epitaxial layer 22 used for SLVT devices. The threshold voltage may be further controlled by way of the dose of the screen layer 20 implant, wherein the higher the dose of screen layer 20 results in a higher threshold voltage. Further tuning of the threshold voltage may be achieved by way of a controlled out-diffusion of material using thermal cycling of anneals, so that a limited diffusion upward of implanted dopants from screen layer 20 results in a further control of the resulting thickness of epitaxial layer 22 and therefore tuning of the threshold voltage. Though not shown, still another option to tune threshold voltage is by way of a separate threshold voltage control layer that may be formed on screen layer 20 prior to formation of epitaxial layer 22. Such separate threshold voltage control layer may preferably be achieved by out-diffusion using thermal cycling as set forth above, or by way of an additional implant step or steps after the screen layer 20 is formed, using the same dopant material or including an additional or different material. For instance, if the screen layer 20 is comprised of antimony of a concentration of $5 \times 10^{19}$ atoms per $cm^3$, the subsequent implant steps may result in a threshold voltage control layer above the screen layer 20 having a concentration of $1 \times 10^{18}$ atoms per cm$^3$, comprising antimony or a combination of antimony and arsenic. In other embodiments, a well region and, if desired, an anti-punch through region may be formed that lies below screen layer 20. Both the well region and anti-punch through region, if present, are doped using the same dopant type (n or p) as the screen layer 20 but having a concentration of at least to one order of magnitude less than the dopant concentration of screen layer 20.

For improved operation, screen layer 20 is preferably a highly uniform screen. In operation, a gate induced electric field and consequent depletion zone extends to the screening layer. Whether the channel above the screen is formed by an undoped blanket epitaxial layer that extends across multiple transistors or a selective epitaxial channel layer formed under each transistor, efforts are made to maintain the channel layer as undoped. Since there is minimal dopant presence in the channel, there is substantially no variation in dopant positioning or concentration in the channel, resulting in channels having high mobility and devices that are well matched. To further improve device matching, the screen layer 20 is preferably maintained as an atomically uniform layer that extends a selected distance from a gate dielectric.

The precise depth and thickness of the undoped epitaxial channel layer is preferably maintained over at least 80% of the gate dielectric area and depth and thickness may slightly increase or decrease along the edge of the gate dielectric due to well proximity or etch effects. Typically, adjacent transistors will have a gate dielectric to screen layer thickness that only varies within a one-half nanometer range, while more distant transistors on the same die will still have a channel layer thickness that varies within one nanometer. Additionally, the screen layer may have a dopant concentration between $1 \times 10^{18}$ and $5 \times 10^{20}$ atoms per cubic centimeter, and further may have a defined thickness of between five (5) and twenty (20) nanometers that preferably varies no more than three (3) nanometers. Maintaining a controlled thickness of screen layer 20 additionally helps to match leakage current and body bias related performance factors. Having a tight control of screen layer 20 positioning leads to a tight control of the depletion zone when the transistor gate is activated, which in turn enables better device matching than without a screen layer 20 and undoped epitaxial channel. For comparison, an epitaxial transistor device having a retrograde dopant profile that is conventionally formed using multiple implants has an irregular depletion zone. Similarly sized transistor devices with an atomically uniform screening layer 20 will have a uniform depletion zone set by screen layer 20 with minimal edge effects.

In FIG. 1C, similar processing steps may be performed to form additional transistor devices such as a second device region 200 and a third device region 300. Selective use of subsequent photoresist layers allow for separate exposure and formation of second device region 200 and third device region 300 as similarly achieved with first device region 100. The differences between first device region 100, second device region 200, and third device region 300 may lie in the thickness of the trench formed in each region and the resulting thickness of the undoped epitaxial layer formed therein. The difference in thickness of the undoped epitaxial layers provide devices with different threshold voltages. In this manner, devices with similar screen layers but different threshold voltages may be formed on a same wafer.

In FIG. 1D, a legacy device may also be formed in a fourth device region 400 through selective exposure and fabrication as performed with the device regions discussed above. Thus, a wafer may include devices with differing threshold voltages as well as devices of differing types. Thus, logic, analog, SRAM, and legacy devices may be fabricated on the same substrate. Gate, source, and drain regions may be formed at each device region using conventional techniques. Halo implants are not required for formation of each device.

In FIG. 1E, additional devices may be formed on the same wafer where threshold voltage differences are not only established through differing thicknesses in the respective undoped epitaxial layers but also through differences in dopant concentrations in the screen layers of the devices. For example, device regions 500 and 600 have screen layers with different dopant concentrations and undoped epitaxial layers with the same thickness. Device regions 700 and 800 have different dopant concentrations in the respective screen layers and different undoped epitaxial layer thicknesses. Device regions 500 and 700 have the same dopant concentrations in the respective screen layers and different undoped epitaxial layer thicknesses. Device regions 600 and 800 have the same dopant concentrations in the respective screen layers and different undoped epitaxial layer thicknesses. Thus, multiple devices may be fabricated in a substrate with various combinations of screen layer dopant concentrations and undoped epitaxial layer thicknesses. For those device regions where the undoped epitaxial layer is of the same thickness, formation of the undoped epitaxial layer in each region may be formed individually as discussed above or simultaneously through group exposure by selective photoresist placement.

Figure 2:
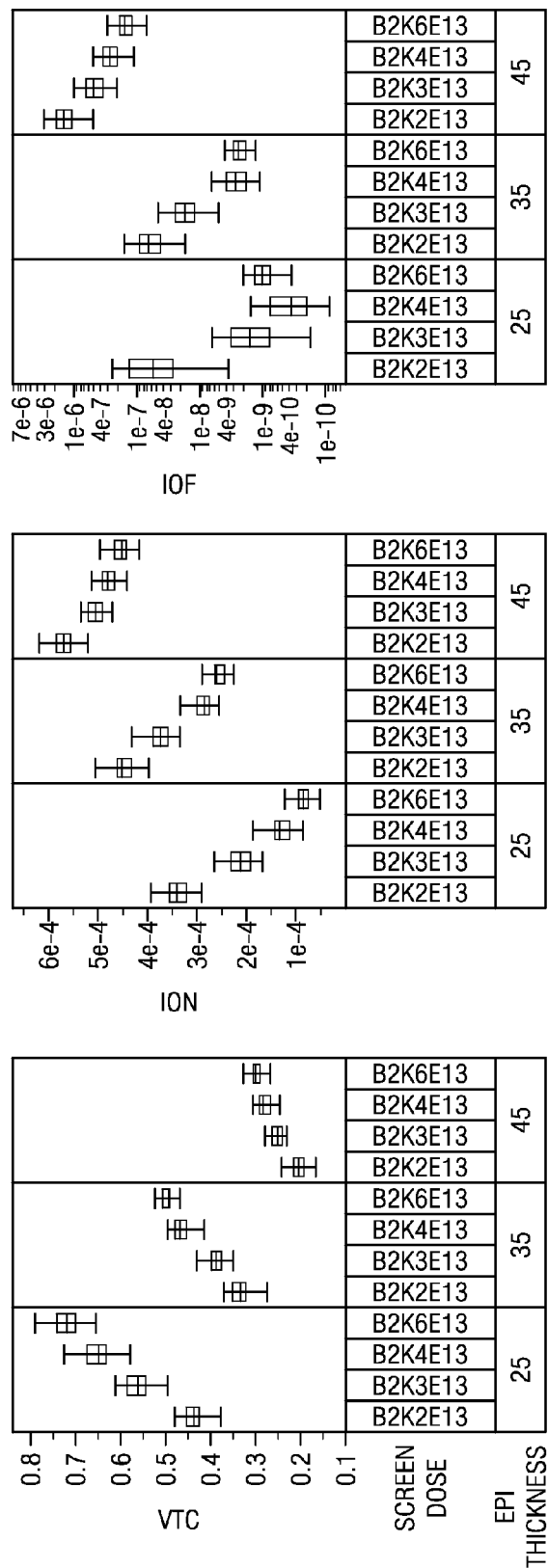
FIG. 2 illustrates a chart showing threshold voltage, Ion current, and Ioff current for various screen layer dopant concentrations and undoped epitaxial channel thicknesses.

FIG. 2 shows an example of a range of devices possible on a single wafer. By varying the dopant concentration of the screen layer and the thickness of the undoped epitaxial layer, varying threshold voltages and Ion/Ioff currents can be achieved. As shown, increases in the dopant concentration in the screen layer provides increases in the threshold voltage of the device. Increases in the thickness of the undoped epitaxial layer provides decreases in the threshold voltage of the device. Thus, the threshold voltage of any device on the wafer can be fine tuned during fabrication through appropriate selection of screen layer dopant concentration and undoped epitaxial layer thickness.

Formation of the screen layer may be performed in different ways in the technique provided above. The screen layers may be formed through ion implantation into the substrate or a well region, through in-situ deposition or growth of doped material, or through intrinsic silicon epitaxial growth followed by ion implantation. The undoped epitaxial layers may be formed through intrinsic silicon epitaxial growth.

Differing types of transistor devices may be formed on substrate 10. For example, both NMOS and PMOS transistor devices may be fabricated on substrate 10. Materials used for the screen layers for the NMOS transistor devices may include boron or other p-type material, with anti-diffusion additives if needed, such as carbon, and/or germanium. For the NMOS transistor devices, ion implantation to establish the screen layers using boron are preferably performed prior to epitaxial growth of the channel layer (and also prior to formation of a threshold voltage control layer where this process step is performed). If desired, a separate threshold voltage layer may be formed after formation of the screen layer by way of a dopant implant onto the screen layer a species of the same type (n or p) as the screen layer, using a dosage and energy selected to result in a threshold voltage layer having a dopant concentration of approximately an order of magnitude less than the concentration of the screen layer.

Thermal cycles in the fabrication process lead to diffusion of the screen layer materials. For proper transistor device operation, it is necessary to prevent screen layer materials from diffusing into the undoped epitaxial layer. The effect of diffusion can be avoided by performing certain annealing processes or performing more thermal cycles prior to epitaxial growth of the channel layer.

Implanted boron is widely known to have poor diffusion performance during device fabrication, especially in thermal cycles of 900° C. or more. To improve the diffusion performance of boron, carbon may be added to protect the implanted boron profiles and germanium may also be added through pre-amorphous implant and solid phase epitaxy for best overall performance. Boron diffusion performance can also be improved through growing fully substitutional boron films by epitaxy in-situ doping. Fully substitutional boron provides superior resistance to anneals as compared to traditional implanted boron. Fully substitutional boron may avoid the use of carbon, germanium, or other stopgaps to protect against downstream thermal processes. Improved transistor performance and reduced fabrication costs may also be achieved from the elimination of extra materials such as carbon and germanium.

Boron diffusion performance can also be improved by a high temperature anneal, for example a 1000° C. spike anneal, to activate the implanted boron. The spike anneal causes the implanted boron to move into substitutional sites. Special anneals can be performed after boron implantation to fully activate the boron prior to subsequent thermal processes that normally cause the poor boron profile diffusion. Subjecting the implanted boron to a laser anneal of 1250° C. or 1300° C. for 400 μsec provides full boron activation in order for the implanted boron to behave like an in-situ doped epitaxial boron film for resistance to diffusion.

Materials used for the screen layers for the PMOS transistor devices in each fabrication process may include arsenic, phosphorous, and/or antimony. When arsenic is used for the PMOS transistor screen, ion implantation of the arsenic is preferably performed prior to epitaxial growth of the channel layer (and also prior to epitaxial growth of any threshold voltage control layer where this process step is performed). To prevent diffusion of screen layer material, a material that has a lower diffusion characteristic may be used. For instance, antimony diffuses less than arsenic in the thermal cycles of the fabrication process. Though antimony has lower diffusion than arsenic, the screen doping profile is sharper with antimony as compared to arsenic at the same doping energy and dopant concentration. This sharper doping profile of antimony can cause higher leakage currents (Id-off) than would be achieved with arsenic as the screen implant for the same epitaxial channel layer thickness. Arsenic tends to provide a lower leakage current than antimony. Leakage current for antimony gets worse at higher implant energies. However, an improvement in leakage current may be achieved by adding arsenic into the antimony implant.

Although the present disclosure has been described in detail with reference to a particular embodiment, it should be understood that various other changes, substitutions, and alterations may be made hereto without departing from the spirit and scope of the appended claims. For example, though not shown, a body tap to at least certain ones of the transistor devices may be formed in order to provide further control of threshold voltage. Although the present disclosure includes a description with reference to a specific ordering of processes, other process sequencing may be followed and other incidental process steps may be performed to achieve the end result discussed herein. Moreover, process steps shown in one set of figures may also be incorporated into another set of figures as desired.

Numerous other changes, substitutions, variations, alterations, and modifications may be ascertained by those skilled in the art and it is intended that the present disclosure encompass all such changes, substitutions, variations, alterations, and modifications as falling within the spirit and scope of the appended claims. Moreover, the present disclosure is not intended to be limited in any way by any statement in the specification that is not otherwise reflected in the appended claims.

What is claimed is:

1. A method for fabricating multiple transistor devices on a substrate with a plurality of threshold voltages, comprising:
    forming a first device in a substrate, the first device including a screen layer with a first dopant concentration, a threshold voltage layer with a second dopant concentration less than the first dopant concentration, and a substantially undoped epitaxial channel with a first thickness thereon, the screen layer, threshold voltage layer, and undoped epitaxial channel of the first device underlying a first gate;
    forming a second device in the substrate electrically isolated from the first device, the second device having a screen layer with a third dopant concentration, a threshold voltage layer with a fourth dopant concentration less than the third dopant concentration, and a substantially undoped epitaxial channel with a second thickness thereon, the screen layer, threshold voltage layer, and undoped epitaxial channel of the second device underlying a second gate, the second thickness being different than the first thickness such that the first and second devices have different threshold voltages;
    wherein a top surface of the substantially undoped epitaxial channel of the first device is substantially coplanar with a top surface of the substantially undoped epitaxial channel of the second device adjacent respective gates of the first and second devices.

2. The method of claim 1, further comprising:
    forming a third device in the substrate, the third device having a screen layer with a third dopant concentration and a substantially undoped epitaxial channel with a third thickness thereon, the third thickness being different than the first and second thicknesses.

3. The method of claim 2, wherein the first, second, and third dopant concentrations are substantially the same.

4. The method of claim 2, further comprising:
    forming a fourth device in the substrate, the fourth device having a screen layer with a fourth dopant concentration and a substantially undoped epitaxial channel with a fourth thickness thereon.

5. The method of claim 4, wherein the third dopant concentration is different than the fourth dopant concentration and wherein the third thickness and the fourth thickness are substantially the same.

6. The method of claim 5, further comprising:
    simultaneously forming the substantially undoped epitaxial channel of the third and fourth devices.

7. The method of claim 1, wherein the first and third dopant concentrations are the same.

8. The method of claim 1, wherein the screen layer of the first device and the screen layer of the second device have substantially the same thickness.

9. The method of claim 1, further comprising:
    forming shallow trench isolation regions in the substrate, the shallow trench isolating regions defining electrically separate device regions for formation of the first and second devices.

10. A method for fabricating multiple transistor devices on a substrate with a plurality of threshold voltages, comprising:

forming a first device in a substrate, the first device including a screen layer with a first dopant concentration, a threshold voltage layer with a second dopant concentration less than the first dopant concentration, and a substantially undoped epitaxial channel with a first thickness thereon, the screen layer, threshold voltage layer, and undoped epitaxial channel of the first device underlying a first gate;

forming a second device in the substrate electrically isolated from the first device, the second device having a screen layer with a third dopant concentration, a threshold voltage layer with a fourth dopant concentration less than the third dopant concentration, and a substantially undoped epitaxial channel with a second thickness thereon, the second thickness being different than the first thickness such that the first and second devices have different threshold voltages, the screen layer, threshold voltage layer, and undoped epitaxial channel of the second device underlying a second gate, wherein a top surface of the substantially undoped epitaxial channel of the first device is substantially coplanar with a top surface of the substantially undoped epitaxial channel of the second device adjacent respective gates of the first and second devices; and forming a third device in the substrate electrically isolated from the first device, the third device having a threshold voltage that is set using a method that does not include a screen layer.

11. A method for fabricating multiple transistor devices on a substrate with a plurality of threshold voltages, comprising:

forming a first device in a substrate, the first device including a screen layer with a first dopant concentration and a substantially undoped epitaxial channel with a first thickness thereon;

forming a second device in the substrate electrically isolated from the first device, the second device having a screen layer with a first dopant concentration and a substantially undoped epitaxial channel with a second thickness thereon, the second thickness being different than the first thickness such that the first and second devices have different threshold voltages; and forming a third device in the substrate electrically isolated from the first device, the third device having a threshold voltage that is set using a method that does not include a substantially undoped epitaxial channel.

12. The method of claim 9, wherein the forming shallow trench isolation regions in the substrate is done before forming the first device and forming the second device.

* * * * *